United States Patent [19]
van Gils

[11] Patent Number: 4,882,731
[45] Date of Patent: Nov. 21, 1989

[54] DATA PROCESSING DEVICE COMPOSED OF FOUR DATA PROCESSING MODULES OF SUBSTANTIALLY IDENTICAL CONSTRUCTION, WITH PROTECTION BOTH AGAINST SIMULTANEOUS SINGLE-BIT FAILURES IN A PLURALITY OF DATA PROCESSING MODULES AND AGAINST FAILURE OF A SINGLE DATA PROCESSIN

[75] Inventor: Willibrordus J. van Gils, Eindhoven, Netherlands

[73] Assignee: U.S. Philips Corporation, New York, N.Y.

[21] Appl. No.: 87,185

[22] Filed: Aug. 19, 1987

[30] Foreign Application Priority Data

Sep. 5, 1986 [GB] United Kingdom ............... 8621469

[51] Int. Cl.⁴ .............................................. G06F 11/10
[52] U.S. Cl. .................................. 371/37.6; 371/68.3; 364/900; 364/943.9
[58] Field of Search ...................... 371/37, 39, 43, 44, 371/38, 68

[56] References Cited

U.S. PATENT DOCUMENTS

| | | | |
|---|---|---|---|
| 4,512,020 | 4/1985 | Krol et al. | 371/37 |
| 4,593,396 | 6/1986 | Anderson | 371/68 |
| 4,648,091 | 3/1987 | Gajjar | 371/37 |
| 4,663,768 | 5/1987 | Ryu | 371/68 |
| 4,698,814 | 10/1987 | Verheul | 371/68 |
| 4,727,546 | 2/1988 | Van Gils | 371/37 |

*Primary Examiner*—Michael R. Fleming
*Attorney, Agent, or Firm*—Thomas A. Briody; Jack E. Haken; Anne E. Barschall

[57] ABSTRACT

A data processing device is composed of four data processing modules (100, 102, 104, 106) which include mutually corresponding processing means (12, 14, 16, 18) and storage modules (28, 30, 32, 34) which are connected thereto, which data processing system includes an interconnection network (82, 84, 86, 88) which is fed by the respective data processing modules in order to apply bytewise generated processing results from any data processing module to any other data processing module. Each data processing module comprises an input decoder (54, 56, 59, 60) for receiving such intercommunicated processing result and therefrom reconstructing a correct bytewise processing result from mutually incongruent processing results so received even in case of failure of one data processing module for feeding to the local processing means. Error protection codes are presented that guarantee the correct operation of the device even if one of the data processing modules fails in an arbitrary manner or, alternatively, up to three single bit errors occur in any particular 32-bit code word. If one data processing module is ignored as an erasure symbol, one bit error may be corrected in the partial 24-bit code word.

4 Claims, 10 Drawing Sheets

$$H_1 = \begin{bmatrix} 1 & 0 & \beta & \beta^2 \\ 0 & 1 & \beta^6 & \beta \end{bmatrix},$$

$$H_2 = \begin{bmatrix} 1 & 0 & \beta & \beta^3 \\ 0 & 1 & \beta^2 & \beta^{12} \end{bmatrix},$$

$$H_3 = \begin{bmatrix} 1 & 0 & \beta & \beta^3 \\ 0 & 1 & \beta^{12} & \beta^4 \end{bmatrix},$$

$$H_4 = \begin{bmatrix} 1 & 0 & \beta & \beta^6 \\ 0 & 1 & \beta^7 & \beta^3 \end{bmatrix},$$

$$H_5 = \begin{bmatrix} 1 & 0 & \beta & \beta^6 \\ 0 & 1 & \beta^8 & \beta^9 \end{bmatrix},$$

$$H_6 = \begin{bmatrix} 1 & 0 & \beta & \beta^8 \\ 0 & 1 & \beta^8 & \beta^3 \end{bmatrix},$$

$$H_7 = \begin{bmatrix} 1 & 0 & \beta^2 & \beta^4 \\ 0 & 1 & \beta^{12} & \beta^2 \end{bmatrix},$$

$$H_8 = \begin{bmatrix} 1 & 0 & \beta^2 & \beta^6 \\ 0 & 1 & \beta^4 & \beta^9 \end{bmatrix},$$

$$H_9 = \begin{bmatrix} 1 & 0 & \beta^4 & \beta^9 \\ 0 & 1 & \beta^8 & \beta^4 \end{bmatrix}.$$

FIG. 2

$$H = \begin{bmatrix} 0 & I & (M^T)^6 & M^T \\ I & 0 & M^T & (M^T)^2 \\ (M^T)^6 & M^T & 0 & I \\ M^T & (M^T)^2 & I & 0 \end{bmatrix}.$$

FIG. 3

| i | $\alpha^i$ | weight | i | $\alpha^i$ | weight |
|---|---|---|---|---|---|
| 0 | 11111111 | 8 | 45 | 01000010 | 2 |
| 1 | 01010110 | 4 | 46 | 11100100 | 4 |
| 2 | 00101011 | 4 | 47 | 11111011 | 7 |
| 3 | 10001011 | 4 | 48 | 10111000 | 4 |
| 4 | 10010101 | 4 | 49 | 11011000 | 4 |
| 5 | 01010010 | 3 | 50 | 11010100 | 4 |
| 6 | 11000101 | 4 | 51 | 11011101 | 6 |
| 7 | 01111000 | 4 | 52 | 10111110 | 6 |
| 8 | 11001010 | 4 | 53 | 11011001 | 5 |
| 9 | 00011010 | 3 | 54 | 01010000 | 2 |
| 10 | 00101001 | 3 | 55 | 00101010 | 3 |
| 11 | 01100100 | 3 | 56 | 00001111 | 4 |
| 12 | 11100010 | 4 | 57 | 01100010 | 3 |
| 13 | 11111010 | 6 | 58 | 11100011 | 5 |
| 14 | 00111100 | 4 | 59 | 01111110 | 6 |
| 15 | 00101111 | 5 | 60 | 11001011 | 5 |
| 16 | 01100101 | 4 | 61 | 10011110 | 5 |
| 17 | 01100110 | 4 | 62 | 11011110 | 6 |
| 18 | 00001101 | 3 | 63 | 11010101 | 5 |
| 19 | 10001101 | 4 | 64 | 01011001 | 4 |
| 20 | 10010100 | 3 | 65 | 01001001 | 3 |
| 21 | 11010110 | 5 | 66 | 01101000 | 3 |
| 22 | 00110010 | 3 | 67 | 11101011 | 6 |
| 23 | 11001001 | 4 | 68 | 10011001 | 4 |
| 24 | 01110001 | 4 | 69 | 01011011 | 5 |
| 25 | 10101001 | 4 | 70 | 10100110 | 4 |
| 26 | 01111101 | 6 | 71 | 00011111 | 5 |
| 27 | 10100000 | 2 | 72 | 01000011 | 3 |
| 28 | 00011110 | 4 | 73 | 01100000 | 2 |
| 29 | 11000111 | 5 | 74 | 00001100 | 2 |
| 30 | 10010111 | 5 | 75 | 00001001 | 2 |
| 31 | 10111101 | 6 | 76 | 01100011 | 4 |
| 32 | 10110010 | 4 | 77 | 01100111 | 5 |
| 33 | 11010000 | 3 | 78 | 10001001 | 3 |
| 34 | 00110011 | 4 | 79 | 01111010 | 5 |
| 35 | 01001101 | 4 | 80 | 00100101 | 3 |
| 36 | 10000110 | 3 | 81 | 01101101 | 5 |
| 37 | 00011000 | 2 | 82 | 10000001 | 2 |
| 38 | 11000110 | 4 | 83 | 10011101 | 5 |
| 39 | 00010011 | 3 | 84 | 10110101 | 5 |
| 40 | 01001010 | 3 | 85 | 01010101 | 4 |
| 41 | 00000011 | 2 | 86 | 01000000 | 1 |
| 42 | 01101011 | 5 | 87 | 00001011 | 3 |
| 43 | 10000000 | 1 | 88 | 10001100 | 3 |
| 44 | 00011001 | 3 | 89 | 00010000 | 1 |

FIG. 3a

| i | α^i | weight | i | α^i | weight |
|---|---|---|---|---|---|
| 90 | 00100001 | 2 | 135 | 01011110 | 5 |
| 91 | 10000011 | 3 | 136 | 11001100 | 4 |
| 92 | 01110010 | 4 | 137 | 00011011 | 4 |
| 93 | 11000010 | 3 | 138 | 10101101 | 5 |
| 94 | 11111101 | 7 | 139 | 10010011 | 4 |
| 95 | 10111001 | 5 | 140 | 01010011 | 4 |
| 96 | 01011100 | 4 | 141 | 01000001 | 2 |
| 97 | 00100011 | 3 | 142 | 10001111 | 5 |
| 98 | 01101100 | 4 | 143 | 01111011 | 6 |
| 99 | 00000101 | 2 | 144 | 10100001 | 3 |
| 100 | 01101010 | 4 | 145 | 10011010 | 4 |
| 101 | 00000100 | 1 | 146 | 00110000 | 2 |
| 102 | 11101110 | 6 | 147 | 00100110 | 3 |
| 103 | 11110011 | 6 | 148 | 00000110 | 2 |
| 104 | 01011111 | 6 | 149 | 00000001 | 1 |
| 105 | 01001000 | 2 | 150 | 10000100 | 2 |
| 106 | 11101100 | 5 | 151 | 11110111 | 7 |
| 107 | 00011100 | 3 | 152 | 10110001 | 4 |
| 108 | 00101000 | 2 | 153 | 10111011 | 6 |
| 109 | 11100000 | 3 | 154 | 10110011 | 5 |
| 110 | 00010101 | 3 | 155 | 01010100 | 3 |
| 111 | 01001011 | 4 | 156 | 11000100 | 3 |
| 112 | 10000111 | 4 | 157 | 11111100 | 6 |
| 113 | 10011100 | 4 | 158 | 00111101 | 5 |
| 114 | 00110001 | 3 | 159 | 10101011 | 5 |
| 115 | 10100010 | 3 | 160 | 10010010 | 3 |
| 116 | 11110001 | 5 | 161 | 11010111 | 6 |
| 117 | 10110000 | 3 | 162 | 10110110 | 5 |
| 118 | 00111111 | 6 | 163 | 00111110 | 5 |
| 119 | 01000100 | 2 | 164 | 11000000 | 2 |
| 120 | 11100101 | 5 | 165 | 00010010 | 2 |
| 121 | 01111111 | 7 | 166 | 11001110 | 5 |
| 122 | 01001111 | 5 | 167 | 11110100 | 5 |
| 123 | 01101001 | 4 | 168 | 11011010 | 5 |
| 124 | 01101111 | 6 | 169 | 00111011 | 5 |
| 125 | 01101110 | 5 | 170 | 10101010 | 4 |
| 126 | 11101010 | 5 | 171 | 00010110 | 3 |
| 127 | 00011101 | 4 | 172 | 00100000 | 1 |
| 128 | 10101100 | 4 | 173 | 00000111 | 3 |
| 129 | 00010111 | 4 | 174 | 10000101 | 3 |
| 130 | 10100100 | 3 | 175 | 01110011 | 5 |
| 131 | 11110000 | 4 | 176 | 01000110 | 3 |
| 132 | 00110100 | 3 | 177 | 00001010 | 2 |
| 133 | 11001000 | 3 | 178 | 00001000 | 1 |
| 134 | 11110101 | 6 | 179 | 11100111 | 6 |

FIG. 3b

| i | α^i | weight | i | α^i | weight |
|---|---|---|---|---|---|
| 180 | 10010000 | 2 | 225 | 01111001 | 5 |
| 181 | 00111000 | 3 | 226 | 01001110 | 4 |
| 182 | 11000001 | 3 | 227 | 11101101 | 6 |
| 183 | 10010110 | 4 | 228 | 10011000 | 3 |
| 184 | 00111001 | 4 | 229 | 11011111 | 7 |
| 185 | 01000101 | 3 | 230 | 01010001 | 3 |
| 186 | 01100001 | 3 | 231 | 10101110 | 5 |
| 187 | 10001000 | 2 | 232 | 11111000 | 5 |
| 188 | 11111110 | 7 | 233 | 11010011 | 5 |
| 189 | 11010010 | 4 | 234 | 01011000 | 3 |
| 190 | 11011100 | 5 | 235 | 11001101 | 5 |
| 191 | 00111010 | 4 | 236 | 10011111 | 6 |
| 192 | 00101110 | 4 | 237 | 01011010 | 4 |
| 193 | 11100001 | 4 | 238 | 00100010 | 2 |
| 194 | 10010001 | 3 | 239 | 11101000 | 4 |
| 195 | 10111100 | 5 | 240 | 11110010 | 5 |
| 196 | 00110110 | 4 | 241 | 11011011 | 6 |
| 197 | 00100111 | 4 | 242 | 10111111 | 7 |
| 198 | 10000010 | 2 | 243 | 01011101 | 5 |
| 199 | 11110110 | 6 | 244 | 10100111 | 5 |
| 200 | 00110101 | 4 | 245 | 10011011 | 5 |
| 201 | 01001100 | 3 | 246 | 10110100 | 4 |
| 202 | 00000010 | 1 | 247 | 11010001 | 4 |
| 203 | 11101111 | 7 | 248 | 10110111 | 6 |
| 204 | 01110111 | 6 | 249 | 10111010 | 5 |
| 205 | 10101000 | 3 | 250 | 00110111 | 5 |
| 206 | 11111001 | 6 | 251 | 10100011 | 4 |
| 207 | 01010111 | 5 | 252 | 01110101 | 5 |
| 208 | 10101111 | 6 | 253 | 01000111 | 4 |
| 209 | 01111100 | 5 | 254 | 10001110 | 4 |
| 210 | 00100100 | 2 | | | |
| 211 | 11101001 | 5 | | | |
| 212 | 01110110 | 5 | | | |
| 213 | 00101100 | 3 | | | |
| 214 | 00001110 | 3 | | | |
| 215 | 11100110 | 5 | | | |
| 216 | 00010100 | 2 | | | |
| 217 | 11001111 | 6 | | | |
| 218 | 01110000 | 3 | | | |
| 219 | 00101101 | 4 | | | |
| 220 | 10001010 | 3 | | | |
| 221 | 00010001 | 2 | | | |
| 222 | 10100101 | 4 | | | |
| 223 | 01110100 | 4 | | | |
| 224 | 11000011 | 4 | | | |

FIG.3c $f_{ij}=1 \iff wt(\underline{s}_i)=j$    $i=1,2,3,4,\ j=0,1,2.$ $g_{ij}=1 \iff wt(\underline{s}_i M^{-1})=j$    $i=1,2,3,4,\ j=1,2.$ $h_{ij}=1 \iff wt(\underline{s}_i M^{-2})=j$    $i=2,4,\ \ \ \ \ j=1,2.$ $h_{ij}=1 \iff wt(\underline{s}_i M^{-6})=j$    $i=1,3,\ \ \ \ \ j=1,2.$ $t_{1j}=1 \iff wt(\underline{s}_3+\underline{u}_j M^6)=1 \text{ and } wt(\underline{s}_4+\underline{u}_j M)=1 \ \ j=1,2,\ldots,8.$ $t_{2j}=1 \iff wt(\underline{s}_3+\underline{u}_j M)=1 \text{ and } wt(\underline{s}_4+\underline{u}_j M^2)=1$    " .

$t_{3j}=1 \iff wt(\underline{s}_1+\underline{u}_j M^6)=1 \text{ and } wt(\underline{s}_2+\underline{u}_j M)=1$    " .

$t_{4j}=1 \iff wt(\underline{s}_1+\underline{u}_j M)=1 \text{ and } wt(\underline{s}_2+\underline{u}_j M^2)=1$    " .

FIG.4a $$\hat{\underline{m}}_{12} := (\underline{r}_1, \underline{r}_2) \begin{bmatrix} M & M^6 \\ M^2 & M \end{bmatrix}$$

$$\hat{\underline{m}}_{13} := (\underline{r}_1, \underline{r}_3) \begin{bmatrix} 0 & M^{13} \\ I & M^{14} \end{bmatrix}$$

$$\hat{\underline{m}}_{14} := (\underline{r}_1, \underline{r}_4) \begin{bmatrix} M^{14} & 0 \\ M & I \end{bmatrix}$$

$$\hat{\underline{m}}_{23} := (\underline{r}_2, \underline{r}_3) \begin{bmatrix} 0 & M^{14} \\ I & M^5 \end{bmatrix}$$

$$\hat{\underline{m}}_{24} := (\underline{r}_2, \underline{r}_4) \begin{bmatrix} M^9 & 0 \\ M^{10} & I \end{bmatrix}$$

$$\hat{\underline{m}}_{34} := (\underline{r}_3, \underline{r}_4)$$

$$\hat{\underline{n}}_{1j} := (\underline{r}_1 + \underline{u}_j, \underline{r}_2) \begin{bmatrix} M & M^6 \\ M^2 & M \end{bmatrix} \quad j=1,2,\ldots,8,$$

$$\hat{\underline{n}}_{2j} := (\underline{r}_1, \underline{r}_2 + \underline{u}_j) \begin{bmatrix} M & M^6 \\ M^2 & M \end{bmatrix} \quad j=1,2,\ldots,8,$$

$$\hat{\underline{n}}_{3j} := (\underline{r}_3 + \underline{u}_j, \underline{r}_4) \quad j=1,2,\ldots,8,$$

$$\hat{\underline{n}}_{4j} := (\underline{r}_3, \underline{r}_4 + \underline{u}_j) \quad j=1,2,\ldots,8.$$

FIG. 4b

| err cl | bool expr | est |
|---|---|---|
| 0000 | RM $f_{10}f_{20}$ | $\hat{p}_{34}$ |
| *000 | RM $\overline{f}_{10}\overline{f}_{20}\overline{f}_{30}\overline{f}_{40}$ | $\hat{m}_{34}$ |
| 0*00 | RM $\overline{f}_{10}\overline{f}_{20}\overline{f}_{30}\overline{f}_{40}$ | $\hat{m}_{34}$ |
| 00*0 | RM $\overline{f}_{10}\overline{f}_{20}\overline{f}_{30}\overline{f}_{40}$ | $\hat{m}_{12}$ |
| 000* | RM $\overline{f}_{10}\overline{f}_{20}\overline{f}_{30}\overline{f}_{40}$ | $\hat{m}_{12}$ |
| 1100 | RM $f_{11}f_{21}$ | $\hat{m}_{34}$ |
| 1010 | RM $h_{11}h_{31}$ | $\hat{m}_{24}$ |
| 1001 | RM $g_{11}g_{41}$ | $\hat{m}_{23}$ |
| 0110 | RM $g_{21}g_{31}$ | $\hat{m}_{14}$ |
| 0101 | RM $h_{21}h_{41}$ | $\hat{m}_{13}$ |
| 0011 | RM $f_{31}f_{41}$ | $\hat{m}_{12}$ |
| 2100 | RM $f_{11}f_{22}$ | $\hat{m}_{34}$ |
| 2010 | RM $h_{11}h_{32}$ | $\hat{m}_{24}$ |
| 2001 | RM $g_{11}g_{42}$ | $\hat{m}_{23}$ |
| 1200 | RM $f_{12}f_{21}$ | $\hat{m}_{34}$ |
| 0210 | RM $g_{21}g_{32}$ | $\hat{m}_{14}$ |
| 0201 | RM $h_{21}h_{42}$ | $\hat{m}_{13}$ |
| 1020 | RM $h_{12}h_{31}$ | $\hat{m}_{24}$ |
| 0120 | RM $g_{22}g_{31}$ | $\hat{m}_{14}$ |
| 0021 | RM $f_{31}f_{42}$ | $\hat{m}_{12}$ |
| 1002 | RM $g_{12}g_{41}$ | $\hat{m}_{23}$ |
| 0102 | RM $h_{22}h_{41}$ | $\hat{m}_{13}$ |
| 0012 | RM $f_{32}f_{41}$ | $\hat{m}_{12}$ |
| 1110 | RM $t_{3j}$ | $\hat{n}_{3j}$ |
| 1101 | RM $t_{4j}$ | $\hat{n}_{4j}$ |
| 1011 | RM $t_{1j}$ | $\hat{n}_{1j}$ |
| 0111 | RM $t_{2j}$ | $\hat{n}_{2j}$ |

FIG.5a

| err cl | bool expr | est |
|---|---|---|
| E000 | $EM_1\ f_{10}$ | $\hat{m}_{34}$ |
| E100 | $EM_1\ f_{11}$ | $\hat{m}_{34}$ |
| E010 | $EM_1\ h_{11}$ | $\hat{m}_{24}$ |
| E001 | $EM_1\ g_{11}$ | $\hat{m}_{23}$ |
|  |  |  |
| 0E00 | $EM_2\ f_{20}$ | $\hat{m}_{34}$ |
| 1E00 | $EM_2\ f_{21}$ | $\hat{m}_{34}$ |
| 0E10 | $EM_2\ g_{21}$ | $\hat{m}_{14}$ |
| 0E01 | $EM_2\ h_{21}$ | $\hat{m}_{13}$ |
|  |  |  |
| 00E0 | $EM_3\ f_{30}$ | $\hat{m}_{12}$ |
| 10E0 | $EM_3\ h_{31}$ | $\hat{m}_{24}$ |
| 01E0 | $EM_3\ g_{31}$ | $\hat{m}_{14}$ |
| 00E1 | $EM_3\ f_{31}$ | $\hat{m}_{12}$ |
|  |  |  |
| 000E | $EM_4\ f_{40}$ | $\hat{m}_{12}$ |
| 100E | $EM_4\ g_{41}$ | $\hat{m}_{23}$ |
| 010E | $EM_4\ h_{41}$ | $\hat{m}_{13}$ |
| 001E | $EM_4\ f_{41}$ | $\hat{m}_{12}$ |

\* Est $\hat{\underline{m}} = \hat{\underline{m}}_{12}$ if $$DSEL_{12} := RM(\bar{f}_{10}\bar{f}_{20}f_{30}\bar{f}_{40} + \bar{f}_{10}\ \bar{f}_{20}\ \bar{f}_{30}f_{40} +$$
$$f_{31}f_{41} + f_{31}f_{42} + f_{32}f_{41}) +$$
$$EM_3\ (f_{30}+f_{31}) + EM_4\ (f_{40}+f_{41}) + SM_{12} = 1.$$

\* Est $\hat{\underline{m}} = \hat{\underline{m}}_{13}$ if $$DSEL_{13} := RM\ (h_{21}h_{41} + h_{21}h_{42} + h_{22}h_{41}) +$$
$$EM_2 h_{21} + EM_4 h_{41} + SM_{13} = 1.$$

\* Est $\hat{\underline{m}} = \hat{\underline{m}}_{14}$ if $$DSEL_{14} := RM\ (g_{21}g_{31} + g_{21}g_{32} + g_{22}g_{31}) +$$
$$EM_2 g_{21} + EM_3 g_{31} + SM_{14} = 1.$$

\* Est $\hat{\underline{m}} = \hat{\underline{m}}_{23}$ if $$DSEL_{23} := RM\ (g_{11}g_{41} + g_{11}g_{42} + g_{12}g_{41}) +$$
$$EM_1 g_{11} + EM_4 g_{41} + SM_{23} = 1.$$

\* Est $\hat{\underline{m}} = \hat{\underline{m}}_{24}$ if $$DSEL_{24} := RM\ (h_{11}h_{31} + h_{11}h_{32} + h_{12}h_{31}) +$$
$$EM_1 h_{11} + EM_3 h_{31} + SM_{24} = 1.$$

\* Est $\hat{\underline{m}} = \hat{\underline{m}}_{34}$ if $$DSEL_{34} := RM\ (f_{10}f_{20} + f_{10}\bar{f}_{20}\bar{f}_{30}\bar{f}_{40} + \bar{f}_{10}f_{20}\bar{f}_{30}\bar{f}_{40} +$$
$$f_{11}f_{21} + f_{11}f_{22} + f_{12}f_{21}) +$$
$$EM_1\ (f_{10}+f_{11}) + EM_2\ (f_{20}+f_{21}) + SM_{34} = 1.$$

\* Est $\hat{\underline{m}} = \hat{\underline{m}}_{ij}$ if $$ISEL_{ij} := RM\ t_{ij} = 1 \qquad i = 1,2,3,4,\ j = 1,2,\ldots,8.$$

$$DET.\ FLAG: \frac{(\Sigma_{i,j} DSEL_{ij} + \Sigma_{i,j} ISEL_{ij}) \cdot}{(RM\ f_{10}f_{20} + EM_1 f_{10} + EM_3 f_{30} + EM_4 f_{40})}.$$

DATA PROCESSING DEVICE COMPOSED OF FOUR DATA PROCESSING MODULES OF IDENTICAL CONSTRUCTION, WITH PROTECTION BOTH AGAINST SIMULTANEOUS SINGLE-BIT FAILURES IN THE DATA PROCESSING MODULES AND AGAINST FAILURE OF A SINGLE DATA PROCESSING MODULE

BACKGROUND TO THE INVENTION

The invention relates to a data processing device which is composed of four processing modules of substantially identical construction, with protection both against coincident single-bit failures in a plurality of data processing modules and also against an arbitrary data failure in a single data processing module. A device of this kind is known from U.S. Pat. No. 4512020 issued to Kroe et al, herein incorporated by reference. The known device operates on the basis of so-called symbols of four bits, while an optimum code as therein presented allows in a so-called 'normal mode' for correcting of two arbitrary single bit errors, at a minimum Hamming distance of five. In an 'erasure' mode, one of the data processing modules is ignored while the code over the remaining three four-bit symbols has a Hamming distance of three, allowing for one additional bit-error to be correctable. If any two data processing modules would fail simultaneously while their identity is known, the two remaining data processing modules, in the absence of further errors, could still function and attain the correct results. The above error protection capability may be expressed in the minimum distance profile of this code at a redundancy of 100% as being (5,3,1). The definition of minimum distance profile is given hereinafter.

SUMMARY OF THE INVENTION

Data processing technology has evolved to processors having an increased bit width. It is an object of the invention to improve the aforesaid error protection capability with the same amount of redundancy, by using 8-bit symbols to optimally realize a minimum distance profile of (7,4,1). That is, in the normal mode the distance is 7, allowing for the correction of three arbitrary single bit errors. It is known in the art, that this degree of protection may also be used to correct up to two arbitrary single bit errors and to detect up to four arbitrary single bit errors. Other trade-offs between correction and detection are well known. In the erasure mode, the minimum Hamming distance of four allows for single-bit correction, double-bit error detection, or alternatively for triple-bit-error detection. Ignoring any combination of two data processing modules in the absence of any further error still allows the two remaining data processing modules to attain correct results.

The object of the invention is realized by a data processing device composed of: four data processing modules (100, 102, 104, 106) which include corresponding data processing means (12, 14, 16, 18) having a data path width of at least 2n bytes; respective encoder modules (20, 22, 24, 26) fed by the associated data processing means for bytewise encoding a processing result of 2n bytes to an encoding result of n bytes; respective memory modules (28, 30, 32, 34) fed by the associated encoder module for storing the encoding result; an interconnection network (82, 84, 86, 88) fed by the respective data processing modules for applying encoding results between all data processing modules; and respective input decoders (54, 56, 58, 60) fed by sai interconnection network for receiving said encoding results in groups of four bytes and therefrom reconstituting a two-byte data word representing said processing result for presentation to the associated data processing means. The data processing device further comprises mode register means for controlling said input decoders in respective first, second and third modes, for in a first mode accepting and digesting all bytes of a said group, for in each of four respective second modes accepting and digesting three bytes of a said group but rejecting an associated fourth byte of the group in question, and for in each of six respective third modes accepting and digesting two bytes of a said group but rejecting an associated combination of two remaining bytes of the group in question. Since encoder modules multiply each byte of a data word by a regular matrix, and add the multiplication bytes to produce a code byte. The four code bytes thus generated by the respective encoder modules constitute a code word, of a code with a minimum Hamming distance over the bits of seven. The three code bytes accepted in any second mode constitute a partial code word with a minimum Hamming distance over the bits of four. The two bytes accepted in any third mode constitute a representation of all bits of the associated processing result.

BRIEF DESCRIPTION OF THE FIGURES

The invention will be explained herein after with respect to a preferred embodiment as exemplified by the following figures:

FIG. 2 gives the parity check matrices of nine codes with respect to bases B43 and B95 having minimum distance profile of (7, 4, 1);

FIGS. 3a, 3b, 3c give the binary representations of the elements of a particular Galois field Gf $(2^8)$;

FIG. 3d is a so-called redundant parity check matrix;

FIG. 4a gives a set of decoding definitions;

FIG. 4b gives a set of message estimates;

FIGS. 5a, 5b give a list of all correctable error classes, their detection and message estimate selection;

FIG. 6 gives the rules to the implemented by a decoder;

FIG. 7 gives a global decode design.

DESCRIPTION OF A PREFERRED EMBODIMENT

Figure 1:
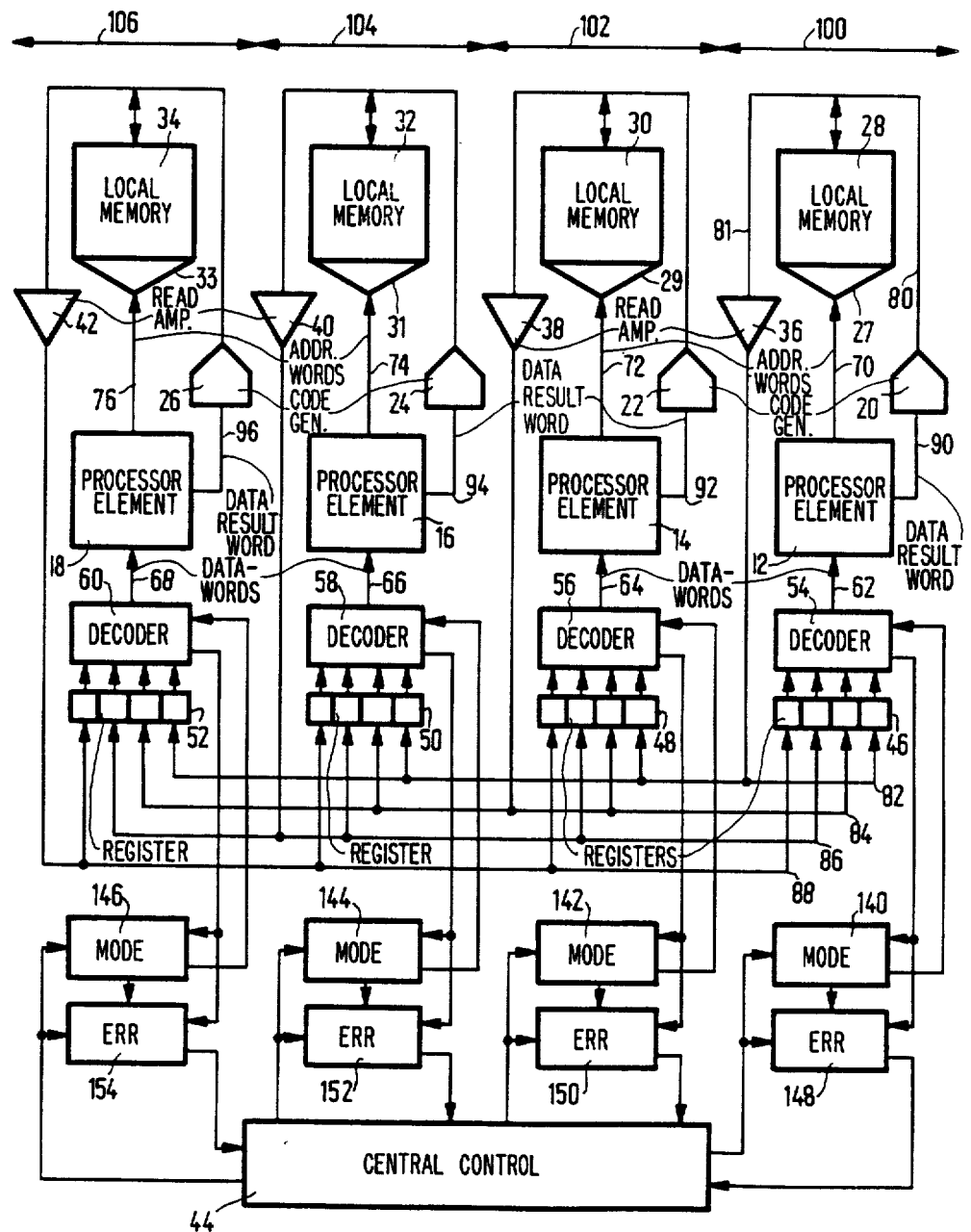
FIG. 1 gives a data processing devices according to the invention.

FIG. 1 gives a data processing device according to the invention. The data consist of words, each word having sixteen bits and representing two symbols of a Galois field to be explained hereinafter. The data words appear on the lines 62, 64, 66, 68. They are processed in the respective processor elements 12, 14, 16, 18. In reaction thereto, the processor elements generate data results words on the lines 90, 92, 94, 96 or address words on the lines 70, 72, 74, 76. A known memory management unit (not shown) may be provided for each of the memory modules. The local memories 28, 30, 32, 34 are addressed via the address decoders 27, 29, 31, 33. From each 16-bit data word received, an 8-bit code symbol is formed in each one of the code generators 20, 22, 24, 26, so that the code symbols formed from one data word together form one code word. These code symbols are presented to the memories 28, 30, 32, 34 in order to be stored. The code symbols after reading are regenerated in the read amplifiers 36, 38, 40, 42. The regeneration can alternatively be realized without intermediate storage in the memories. The code symbols can all be applied to all registers 46, 48, 50, 52. These registers are connected to the reconstruction devices or decoders 54, 56, 58, 60 for reconstructing the data words from the code words for presentation to the lines 62, 64, 66, 68.

The combination of elements 46, 54, 12, 20, 28 and 36 is included in a single separate error isolation zone and correspondingly for further zones. It is assumed that the errors in two different zones ae independent; this requirement is satisfied for many categories of errors if each error-isolation zone covers, for example, a separate printed circuit board plus components, or alternatively a separate integrated circuit. The circuit shown in the figure thus forms four respective error isolation zones. The synchronization of the operations in the four error isolation zones has been omitted for the sake of clarity. The processors operate in accordance with programs. The construction of the sub-systems in the relevant error-isolation zones is identical, except for the code generators (20, 22, 24, 26) which each implement a different algorithm for forming the four respective code symbols from the 16-bit data word. Furthermore, the control of the data reconstruction devices 54, 56, 58, 60 may differ depending on the control mode of the computer system.

It has been found that the normal mode which is capable of correcting up to three arbitrarily situated bit errors or a one-symbol error is very well suited for the correction of errors occurring in the memory. These latter errors usually are mutually independent and, moreover, are often so-called "soft errors". Symbol errors which render an entire symbol unreliable are usually caused by a faulty processor. These may be treated in an erasure mode wherein all data and/or control signals produced by a selectable error isolation zone or data processing module are ignored. It has been found that such symbol errors are usually of a permanent nature. However, they need not be repaired at short notice in this computer system, because the decodes can switch over to the erasure mode. It has been found advantageous to switch to the erasure mode as soon as necessary.

Furthermore, each error-isolation zone in FIG. 1 comprises a separate error register (148,150,152,154) which is controlled by output signals from the relevant decoder (54,56,58,60) and whose output signals are applied to the central control device 44. Finally there are shown reset lines for the error registers from the central control unit 44. The multiplicity of these control lines is not shown. Furthermore, each error-isolation zone comprises a respective 4-bit mode register 140, 142, 144, 146. The mode registers are controlled by output signals from the associated decoders (54,56,58,60). The content of each mode register controls the operating mode of the associated decoder. The setting of the error register is co-controlled by the content of the associated mode register. This relation is indicated each time by an additional arrow. Finally, each mode register receives control signals form the central control device 44.

In another realization, the central control is distributed over the four data processing modules. The communication system for communicating control messages between those distributed control modules (not shown) may be executed according to earlier Netherlands Patent Application No. 8402472 or corresponding U.S. patent application Ser. No. 758932 to Applicant, herein incorporated by reference. The communication scheme allows for arbitrary malfunction of one data processing module.

In the arrangement of FIG. 1, in the error-free condition, the same program is executed in all isolation zones. This is also applicable in the normal mode. However, if a systematic disturbance occurs in a given error isolation zone, the symbol error having up to the bit weight 8 resulting therefrom, is detected in the other isolation zones. These zones will switch over to the erasure mode, so that the faulty isolation zone is no longer taken into account. In the faulty isolation zone itself the signalling need not be correct. It may even occur that completely different control occurs (for example, due to a failure of the mode register). However, the system as a whole continues to operate correctly thanks to the three other error isolation zones.

CONSTRUCTION OF POSSIBLE CODES

In this section, the constructions of [4,2] codes over the Galois field GF ($2^8$) having minimum distance profile (7,4,1) are described.

As alphabet we take GF ($2^8$)=0, 1, $\alpha$, $\alpha^2$, ... $\alpha^{254}$, where $\alpha$ is a primitive root of the primitive polynomial $x^8+x^4+x^3+x^2+1$ (for an extensive treatment of Galois fields, see F. J. MacWilliams and D. J. A. Sloane, "The Theory of Error-correcting Codes", North Holland Publ. Cy. Amsterdam 1977).

With respect to a basis $<\alpha^{b(0)}, \alpha^{b(1)}, \ldots, \alpha^{b(7)}>$ of GF ($2^8$) over GF (2), the elements of GF ($2^8$) can be represented as binary vectors of length 8. For $\gamma \in$ GF ($2^8$), ($a_0, a_1, \ldots, a_7$) is the binary representation of $\gamma$ if $$\gamma = \sum_{i=0}^{7} a_i \alpha^{b(i)}$$

A [4,2] code over GF ($2^8$) has a systematic parity-check matrix of the following form:

$$H = \begin{bmatrix} 1 & 0 & \alpha^{p_{11}} & \alpha^{p_{12}} \\ 0 & 1 & \alpha^{p_{21}} & \alpha^{p_{22}} \end{bmatrix}$$

The problem is to find an 8-tuple (b(0), b(1), ..., b(7)) and a 4-tuple ($p_{11},p_{12},p_{21},p_{22}$) such that the [4,2] code with parity check matrix H has a "large" minimum distance profile with respect to the basis $<\alpha^{b(0)}, \alpha^{b(1)}, \ldots, \alpha^{b(7)}>$. The minimum distance profile of any [4,2] code over Gf($2^8$) can be proven to have no higher elements than those of the profile (8,4,1). No analytical expression, however, exists for the actually attainable minimum distance profile. The elements of the minimum distance profile constitute a decreasing series.

The Galois field GF ($2^8$) has a very large number ($\sim 10^{12}$) of bases, so it is impractible to evaluate all of them. Furthermore, each different basis gives rise to an appreciable number of different codes, as follows from the embodiment described hereinafter. On the other hand, although the fraction of codes that have an optimum distance profile is very low, in itself the number of these optimum codes is large. Therefore, the following search strategy is presented. In the first place, we have restricted ourselves to the normal bases of GF($8$), of which there are only 16:

$$B_j = <\alpha^{j \cdot 2^i}, i = 0, 1, 2, \ldots, 7>,$$

where $j = 5, 9, 11, 15, 21, 29, 39, 43, 47, 53, 55, 61, 63, 87, 91, 95$. In itself, these normal bases are known in the art. With respect to each of these normal bases, we have searched for 4-tuples ($p_{11}$, $p_{12}$, $p_{21}$, $p_{22}$) that give "good" codes. These normal bases, in combination with the $255^4$ possible four-tuples give rise to $255^4 \times 16$ candidate codes. This large number of codes each give rise to a particular minimum distance profile. It is possible to postulate a search operation for finding four-tuples that yield good codes. This is described hereinafter. The outcome of this search was all four-tuples for which the corresponding [4,2] code produces a minimum distance profile of (7,4,1) with respect to a given normal basis.

With respect to the bases $B_i$,$= i = 5, 9, 15, 21, 29, 39, 53, 55, 61, 63, 87, 91$, no [4,2] code over GF($2^8$) having minimum distance profile (7,4,1) or (8,4,1) exists.

With respect to the bases $B_{11}$ and $B_{47}$ essentially only one [4,2] code having minimum distance profile (7,4,1) exists, i.e. the one with parity-check matrix $$H = \begin{bmatrix} 1 & 0 & \beta & \beta^{12} \\ 0 & 1 & \beta^3 & \beta^4 \end{bmatrix}$$

where $\beta = \alpha^{17}$ (so $\beta \epsilon$ GF ($2^4$): $\beta$ is an element of a sub-field.

With respect to the bases $B_{43}$ and $B_{95}$ essentially 9 codes having minimum distance profile (7, 4, 1) exist, that are the ones with the parity-check matrices shown in FIG. 2.

Other, equivalent, codes can be obtained by permuting columns of the associated matrix H or/and by pre-multiplying these matrix H by 2 by 2 regular matrices over GF($2^8$).

With respect to the normal bases of GF($2^8$), [4,2] codes having minimum distance profile (8, 4, 1) do not exist. The above is a limited demonstration of the code finding strategy. For brevity, no other codes have been presented. It is considered extremely unlikely that an (8, 4, 1) code would really exist for any other basis.

DECODER CONSTRUCTION

Hereinafter the construction of a decoder embodiment is considered.

Let us consider the [4,2] code C over the Galois field F: = GF($2^8$) with parity-check matrix $$H_s = \begin{bmatrix} 1 & 0 & \beta & \beta^2 \\ 0 & 1 & \beta^6 & \beta \end{bmatrix}.$$

The matrix $$G_s = \begin{bmatrix} \beta & \beta^6 & 1 & 0 \\ \beta^2 & \beta & 0 & 1 \end{bmatrix}$$

is a generator matrix of this code, which has a minimum distance profile (7,4,1) with respect to the basis $B_{43} = <\alpha^{43}, \alpha^{86}, \alpha^{172}, \alpha^{89}, \alpha^{178}, \alpha^{101}, \alpha^{202}, \alpha^{149}>$. Let M be the 8 by 8 binary matrix whose $i^{th}$ row is the binary representation of $\beta \alpha^{43 \cdot 2^i}$ with respect to the basis $B_{43}$. The binary representation of the elements of GF($2^8$) = 0, 1, $\alpha$, $\alpha^2$, ..., $\alpha^{254}$, where $\alpha$ is a root of $x^8 + x^4 + x^3 + x^2 + 1 = 0$, with respect to the basis $B_{43}$ is given in FIGS. 3a, 3b, 3c. So, the binary image of the matrix $G_s$ is $$G_{bin} = \begin{bmatrix} M & M^6 & I & 0 \\ M^2 & M & 0 & I \end{bmatrix}$$

and the binary image of $H_s$ is $$H_{bin} = \begin{bmatrix} I & 0 & M^T & (M^T)^2 \\ 0 & I & (M^T)^6 & M^T \end{bmatrix}.$$

For decoding the "redundant" parity-check matrix is used, shown in FIG. 3d.

A codeword $\underline{c} = (\underline{c}_1, \underline{c}_2, \underline{c}_3, \underline{c}_4)$ of the [4,2] code C over GF ($2^8$) consists of four symbols $\underline{c}_i$, $i = 1, 2, 3, 4$ of 8 bits each. The syndrome of a corrupted codeword $\underline{r} = (\underline{r}_1, \underline{r}_2, \underline{r}_3, \underline{r}_4) = (\underline{c}_1, \underline{c}_2, \underline{c}_3, \underline{c}_4) + (\underline{e}_1, \underline{e}_2, \underline{e}_3, \underline{e}_4)$ is defined by $$s = \underset{(r_1, r_2, r_3, r_4)}{(s_1, s_2, s_3, s_4)} = \times \begin{bmatrix} 0 & I & M^6 & M \\ I & 0 & M & M^2 \\ M^6 & M & 0 & I \\ M & M^2 & I & 0 \end{bmatrix}.$$

For a binary vector $\underline{x}$, the weight wt($\underline{x}$) of $\underline{x}$ is defined to be the number of components in $\underline{x}$ equal to one (=different from zero).

Now, we will define a number of sets. The set (*000) is defined by $\{(\underline{x},\underline{0},\underline{0},\underline{0}: \underline{x} \epsilon F, \underline{x} \neq \underline{0})\}$. This corresponds to an error pattern that would only corrupt the first symbol of the code word. In an analogous way the sets (0*00), (00*0), and (000*) are defined.

The sets (ijkm), i,j,k,m $\epsilon$ {0,1,2,} are defined by $\{(\underline{u},\underline{v},\underline{w},\underline{x}): \underline{u},\underline{v},\underline{w},\underline{x} \epsilon F, \text{wt}(\underline{u}) = i, \text{wt}(\underline{v}) = j, \text{wt}(\underline{w}) = k, \text{wt}(\underline{x}) = m\}$. These sets define error patterns that would disturb at most two bits in any code symbol. An erasure, i.e. a known data processing module to have failed beyond correctibility, will be denoted by "E". The sets (Ejkm), j,k,m $\epsilon$ {0,1}, are defined by $\{(\underline{u},\underline{v},\underline{w},\underline{x}): \underline{u},\underline{v},\underline{w},\underline{x} \epsilon F, \text{wt}(\underline{v}) = j, \text{wt}(\underline{w}) = k, \text{wt}(\underline{x}) = m\}$.

In this set no restriction on $\underline{u}$ is set, because it is considered as an erasure and is completely ignored. These sets define error patterns having at most a single bit error outside the erased code symbol. In an analogous way, (iEjk), (iEjk), and (ijkE) are defined. The sets defined by all the above four-tuples are called error classes. The set U of correctable error patterns is the union of the error classes shown in FIGS. 5a, 5b (first column). Herein, an asterisk is an arbitrary symbol error, an E is an erasure symbol, and integers indicate the number of bit errors in the associated symbol.

For a fixed error class in the set U of correctable error patterns, the syndromes of its elements have some property in common. For example, all error patterns e in the error class (*000) have in common that their syndromes $\underline{s} = (\underline{s}_1, \underline{s}_2, \underline{s}_3, \underline{s}_4)$ satisfy $s_1=0, s_2\neq 0, s_3\neq 0, s_4=0$. All error patterns $\underline{e}$ in the error class $\overline{(i0j0)}$ have in common that their syndromes $\underline{s}=(s_1,s_2,s_3,s_4)$ satisfy $wt(\underline{s}_1 M^{-6})=j$ and $wt(\underline{s}_3 M^{-6})=i$. We shall use such properties shared by elements in an error class in the decoding process. Therefore, we have constructed a set of boolean expressions, one for each error class contained in the set U of correctable error patterns, such that these boolean expressions are mutually exclusive and such that each error pattern in an error class from U satisfies the boolean expression corresponding with that error class. These boolean expressions are given by way of example, in the first place, because they relate to the specific code given supra (which is one of many), in the second place because other sets of boolean expressions may be chosen for this particular code.

For all error classes containing elements of which at least two symbols are correct this can be done easily. If it is an error pattern predicted to be in such an error class, then also the estimation of the message is straightforward, because at least two symbols (the correct ones) of the corrupted codeword of the [4,2] code determine the corresponding message uniquely.

For error classes containing elements of which three symbols have weight one, we have to determine the bit error in one of the symbols. If this is done, we have two correct codeword symbols. From these the sent message is estimated.

To construct the above-mentioned boolean variables, we need the following definitions. By $\underline{u}_j$ we denote the binary vector of length 8 having a one on the $j^{th}$ position and zeroes elsewhere.

DEFINITIONS

FIG. 4a gives a set of definitions to start with. The following modes of the decoder are defined:

RM=1 if and only if the decoder is running in random $\bar{\text{mode}}$ i.e. all outputs of the four slices (data processing modules) are considered in the decoding process;

$EM_i=1$ if and only if the decoder is running in erasure mode i, i.e. slice i is considered to be malfunctioning (producing an erasure);

$SM_{ij}=1$ if and only if the decoder is running in single mode, i.e. only the slices i and j are considered to be functioning correctly;

FIG. 4b gives a set of estimates for the message.

Figures 5B, 7:
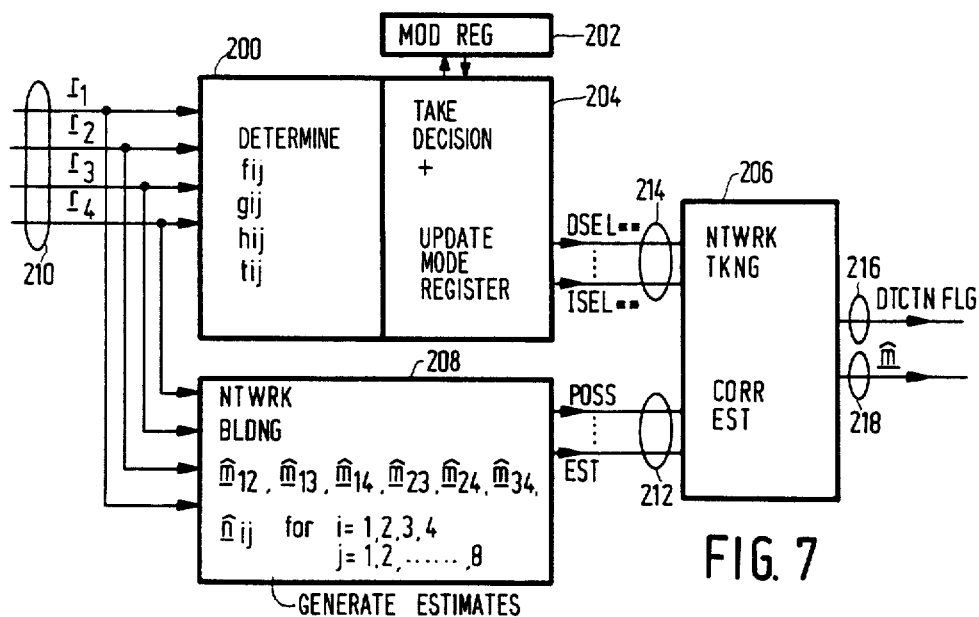

FIGS. 5a, 5b give a list of all correctable error clases (EC), the corresponding boolean expression to be used (BE) and the associated message estimate (ME) for all error classes of correctable error patterns. Again, an asterisk indicates an arbitrary symbol error. An 'E' indicates an erasure symbol of which the location is known, Integers 0, 1, . . . indicate the number of bit errors in the associated shymbol. (Zero indicates a correct symbol). Integers 3, 4, . . . would be represented by an asterisk. Three or more bit errors in one (non-erasure) symbol, combined with any non-zero error pattern in the other symbols could not be corrected with 100% effectiveness.

For example, an error pattern $\underline{e}$ in (1100) satisfies the boolean expression RM $f_{11} f_{21}=\bar{1}$, and the message can be estimated by $\bar{m}_{34}$ (note that the AND-ing dots have not been shown). An error pattern $\underline{e}$ in (10E0) satisfies the boolean expression $EM_3 h_{31}=\bar{1}$, and the message can be estimated by $\bar{m}_{24}$. An error pattern $\underline{e}$ in (1101) satisfies the boolean expression RM $t_{4j}=1$ for exactly one j in $\{1, \ldots, 8\}$, and the message can be estimated by $\underline{n}_{4j}$.

From FIGS. 5a, 5b we can see that the decoder should implement the logic expressions shown in FIG. 6. Herein, the last expression gives the condition which must be met for a detection flag that is generated if the syndrome produced is a non-zero syndrome that does not correspond to a correctable error pattern.

FIG. 7 gives a global design of a decoder. The decoder has a mode register 202 containing the values of RM, $EM_i$, and $SM_{ij}$ for i, j=1, 2, 3, 4, $i\neq j$, After a decoding step, the mode register is updated also. One of the possible strategies could be to switch from random mode to erasure mode when a single symbol error occurs not being a single bit error. Other switching strategies would depend on the error statistics of the entire system. For brevity, no further discussion thereof is presented.

In the decoder, also other kinds of registers could be implemented, for example a register storing the positions and frequencies of bit errors.

In particular, in FIG. 7 on inputs 210 the four, possibly corrupted, code symbols $\underline{r}_1,\underline{r}_2,\underline{r}_3,\underline{r}_4$ appear. In block 200 a network is present for determining the binary quantities $f_{ij}, g_{ij}, h_{ij}, t_{ij}$. In block 204 a network is present for upon the basis of these 60 values generating the decision taking signals DSEL and ISEL, and also for updating the mode register and other registers named hereabove. To effect this, block 204 also receives the mode control signals from mode register 202. In block 208, upon the basis of the four code symbols $\underline{r}_1 \ldots \underline{r}_4$, the six possible estimates based upon two correct symbols are generated, and also the 32 estimated, for each symbol having a one-bit correction on position j. On line 212 these 38 possible estimates are produced while the selecting signals appear on lines 214. In block 206 a network is present for gating the correct estimate, which appears on line 218 (note that this selection need not always be unique), while also on output 216 a detection flag is produced for signalling an uncorrectable, detected error (it would also be possible for an undetectable error to occur.) In the above it was assumed that a processing word was sixteen bits (i.e. two bytes), and a code word was thirty-two bits. If the data path in the (micro-) processor would be still wider, on the one hand, a transition to sixteen-bit symbols could be envisaged which would allow for a still further increased error protection capability. On the other hand, the apparatus could still work with code words for four symbols, each code word, for example relating to only one half of a computer word. The advantage of the latter would lie in the simplified processing of eight-bit symbols with respect to sixteen-bit symbols.

THE SEARCH PROCESS FOR GOOD CODES.

Hereinafter, the search process for good codes is described. Given a basis $<\alpha^{b(0)}, \alpha^{b(1)}, \ldots, \alpha^{b(7)}>$, the search algorithm determines all four-tuples $p_{11}, p_{12}, p_{21}, p_{22}$, $$0 \leq p_{11} \leq 254,$$
$$p_{11} \leq p_{12} \leq 254,$$
$$p_{11} \leq p_{21} \leq 254,$$
$$p_{11} \leq p_{22} \leq 254,$$
$$p_{11} \neq p_{22} \text{ or } (p_{11} = p_{22} \text{ and } p_{12} \leq p_{21}),$$

such that the [4,2] code with parity-check matrix $$H_c = \begin{bmatrix} 1 & 0 & \alpha^{p11} & \alpha^{p12} \\ 0 & 1 & \alpha^{p21} & \alpha^{p22} \end{bmatrix}$$

has a minimum distance profile of at least (7,4,1) with respect to the basis $<\alpha^{b(0)}, \alpha^{b(1)}, \ldots, \alpha^{b(7)}>$. This can be done by checking a number of conditions on the four-tuples $(p_{11}, p_{12}, p_{21}, p_{22})$.

Therefore we need the following definitions:

$$V_1 := \{i: wt(\alpha^i) = 1\} = \{b(0), b(1), \ldots, b(7)\},$$
$$V_2 := \{i: wt(\alpha^i) = 2\},$$
$$W_1 := \{(v_1 - v'_1) \bmod 255: v_1, v'_1 \epsilon V_1\},$$
$$W_2 := \{(v_2 - v'_2) \bmod 255: v_2, v'_2 \epsilon V_2\},$$
$$W_{12} := \{(v_1 - v_2) \bmod 255: v_1 \epsilon V_1, v_2 \epsilon V_2\}$$
$$U \quad \{(v_2 - v_1) \bmod 255: v_1 \epsilon V_1, v_2 \epsilon V_2\}.$$

For all $v \epsilon V_2 : X_v := \{(u-v) \bmod 255 : u \epsilon V_2\}$.

For a set $X \epsilon \{0, 1, 2, \ldots, 254\}$, $\overline{X}$ denotes the complement of X with respect to $\{0, 1, 2, \ldots, 254\}$: $\overline{X} = \{0, 1, 2, \ldots, 254\} \backslash X$. The function Z(.) denotes the Zech's algorithm, which is defined by the equation $$1 + \alpha^n = \alpha^{Z(n)} \text{ for } n \{1, 2, 3, \ldots, 254\}.$$

The [4,2] code with parity-check matrix $H_c$ has a minimum distance profile map with respect to the basis $<\alpha^{b(0)}, \alpha^{b(1)}, \ldots, \alpha^{b(7)}>$, that satisfies $^*mdp \geq (3, 2, 1)$ if and only if $(A): p_{11} - p_{12} \neq p_{21} - p_{22}$;

$^*mdp \geq (4, 3, 1)$ if and only if $(A)$ and $(B1): p_{11}, p_{12}, p_{21}, p_{22} \epsilon \overline{W_1}$;
and $(B2): p_{11} - p_{12}, p_{11} - p_{22}, p_{22} - p_{12}, p_{22} - p_{21} \epsilon \overline{W_1}$;
and $(B3): p_{12} + Z(p_{11} + p_{22} - p_{12} - p_{21})$,
$p_{21} + Z(p_{11} + p_{22} - p_{12} - p_{21})$,
$p_{11} + Z(-p_{11} - p_{22} + p_{12} + p_{21})$,
$p_{22} + Z(-p_{11} - p_{22} + p_{12} + p_{21}) \epsilon \overline{W_1}$;

$^*mdp \geq (5, 3, 1)$ if and only if $(A)$ and $(B1, B2, B3)$ and $(C)$: For all $i, j \epsilon V_1 \times V_1$:
$i + p_{11} + Z(j - i + p_{12} - p_{11}) \epsilon \overline{V_1}$ or
$i + p_{21} + Z(j - i + p_{22} - p_{21}) \epsilon \overline{V_1}$;

$^*mdp \geq (6, 4, 1)$ if and only if $(A)$ and $(B1, 2, 3)$ and $(C)$ and $(D1): p_{11}, p_{12}, p_{21}, p_{22} \epsilon \overline{W_{12}}$;

and $(D2): p_{11} - p_{12}, p_{11} - p_{21}, p_{22} - p_{12}, p_{22} - p_{21} \epsilon \overline{W_{12}}$;
and $(D3): p_{12} + Z(p_{11} + p_{22} - p_{12} - p_{21})$,
$p_{21} + Z(p_{11} + p_{22} - p_{12} - p_{21})$,
$p_{11} + Z(-p_{11} - p_{22} + p_{12} + p_{21})$,
$p_{22} + Z(-p_{11} - p_{22} + p_{12} + p_{21}) \epsilon \overline{W_{12}}$;
and $(D4)$: For all $i, j \epsilon V_1 \times V_1$:

-continued $i + p_{21} + Z(j - i + p_{22} - p_{21})$,
$i + p_{11} + Z(j - i + p_{12} - p_{11})$,
$i - p_{12} - Z(p_{11} + p_{22} - p_{12} - p_{21}) +$
$Z(j - i + p_{11} - p_{21})$,
$i - p_{11} - Z(-p_{11} - p_{22} + p_{12} + p_{21}) +$
$Z(j - i + p_{12} - p_{22}) \epsilon \overline{V_1}$;

$^*mdp \geq (7, 4, 1)$ if and only if
$(A)$ and $(B1, 2, 3)$ and $(C)$ and $(D1, 2, 3, 4)$ and $(E1)$: For all $u \epsilon V_2$:
$(p_{11} \epsilon \overline{X_u}$ or $p_{21} \epsilon \overline{X_u})$
and $(p_{12} \epsilon \overline{X_u}$ or $p_{22} \epsilon \overline{X_u})$
and $(p_{12} + Z(p_{11} + p_{22} - p_{12} - p_{21}) \epsilon \overline{X_u}$ or
$(p_{22} - p_{21}) \epsilon \overline{X_u})$
and $(p_{22} + Z(-p_{11} - p_{22} + p_{12} + p_{21}) \epsilon \overline{X_u}$ or
$p_{12} - p_{11} \epsilon \overline{X_u})$;
and $(E2)$: For all $(i,j) \epsilon V_1 \times V_1$:
$i + p_{11} + Z(j - i + p_{12} - p_{11}) \epsilon \overline{V_2}$ or
$i + p_{21} + Z(j - i + p_{22} - p_{21}) \epsilon \overline{V_2}$;
and $(E3)$: For all $(u,v) \epsilon V_2 \times V_2$:
$(u - v = p_{12} - p_{11})$
or $(u - v = p_{22} - p_{21})$
or $((u - v \neq p_{12} - p_{11})$ and
$(u - v \neq p_{22} - p_{21})$ and
$(u + p_{11} + Z(v - u + p_{12} - p_{11}) \epsilon \overline{V_1}$ or
$(u + p_{21} + Z(v - u + p_{22} - p_{21}) \epsilon \overline{V_1}))$;
and $(E4)$: For all $i \epsilon V_1$ and $u \epsilon V_2$:
$(i + p_{11} + Z(u - i + p_{12} - p_{11}) \epsilon \overline{V_1}$ or
$i + p_{21} + Z(u - i + p_{22} - p_{21}) \epsilon \overline{V_2})$
and $(i + p_{12} + Z(u - i + p_{11} - p_{12}) \epsilon \overline{V_1}$ or
$i + p_{22} + Z(u - i + p_{21} - p_{22}) \epsilon \overline{V_2})$
and $(i + p_{21} + Z(u - i + p_{22} - p_{21}) \epsilon \overline{V_1}$ or
$i + p_{11} + Z(u - i + p_{12} - p_{11}) \epsilon \overline{V_2})$
and $(i + p_{22} + Z(u - i + p_{21} - p_{22}) \epsilon \overline{V_1}$ or
$i + p_{12} + Z(u - i + p_{11} - p_{12}) \epsilon \overline{V_2})$.

DEFINITION AND PROPERTIES OF THE MINIMUM DISTANCE PROFILE OF A CODE

Herein an exact definition of the minimum distance profile of a code is given and also some properties thereof.

Consider a linear [n,m] code of length n and dimension m over the field $F := GF(2^k)$ having minimum (symbol) distance S. The elements of F are symbols. Any symbol c can be represented by a binary k-vector $\underline{c}$. The (binary) weight $wt(\underline{c})$ of a symbol $c \epsilon F$ with respect to the chosen vector representation is defined as the number of ones in the binary vector representation $\underline{c}$ of c. The (binary) weight of a vector of symbols is defined as the sum of the (binary) weights of its components.

The weight profile of an n-vector $c = (c_0, c_1, \ldots, c_{n-1})$ of symbols of F, called a word, is defined as the vector $wp(\underline{c}) := $ $(wp(\underline{c}|0), wp(\underline{c}|1), \ldots, wp(\underline{c}|S - 1))$ where the component $wp(\underline{c}|j)$ is defined by $wp(\underline{c}|j) := $ minimum $\{\Sigma_{i \epsilon A_j} wt(\underline{c_i})$:

$A_j \epsilon \{0, 1, \ldots, n - 1\}, |A_j| = n - j, i = 0, 1, \ldots, S - 1\}$.

Thus $wp(\underline{c}|j)$ is the minimum of the weights of all vectors of length $n-j$ obtained from c by deleting j components from c. For example, $c = (\overline{1}001, 1101, 0010)$ has weight profile $wp(\underline{c}) = (6, 3, \overline{1})$. The minimum distance profile d(C) of the linear code C is defined by
d(C):=((d(C|0), d(C|1), ..., d(C|S−1)), where $$d(C|j) := \text{minimum } (wp(\underline{c}|j): \underline{c} \in C, \underline{c} \neq \underline{0}), j=0, 1, \ldots, S-1.$$

If one takes n−j arbitrary components of an arbitrary nonzero codeword in C, then the sum of the weights of these n−j components is at least d(C|j). There also is a codeword in the code C having n−j components whose weights add up to exactly d(C|j).

A pair (s,t) is called a description of a word $\underline{x} \in F^n$ if it is possible to delete s nonzero components from $\underline{x}$ such that the sum of the weights of the remaining components equals t. The set of all possible descriptions of $\underline{x}$ is called the description set of $\underline{x}$. For example the description set of (1001, 1101, 0010) is {(0,6), (1,3), (1,4), (1,5), (2,1), (2,2), (2,3), (3,0)} and the description set of (0000, 1001, 1000) is {(0,3), (1,1), (1,2), (2,0)}.

A finite set $A := \{(a_1,b_1), (a_2,b_2), \ldots, (a_{|A|}, b_{|A|})\}$ of pairs of natural numbers is called a list of pairs if all first components $a_i$, $i=1, \ldots, |A|$ of the pairs in A are mutually different. We say that a word $\underline{x}$ is covered by A, A being a list of pairs, if at least one of its descriptions (s,t) is covered by at least one pair in A, i.e. if at least one pair $(a_i, b_i)$ of A satisfies $a_i \geq s$, $b_i \geq t$.

Let T and U be two lists of pairs. The code C is said to be simultaneously T-correcting and U-detecting if it corrects all errors $\underline{e}$ covered by T and if it detects all errors $\underline{e}$ which are covered by U and which are not covered by T. If $U = \phi$ then C is called T-correcting, if $T = \phi$ then C is called U-detecting. It is immediately clear that C is simultaneously T-correcting and U-detecting if and only if 1. None of its cosets contains more than one word covered by T.
2. If a coset does contain a word covered by T then it does not contain a word that is covered by U and not covered by T.

This is equivalent with saying that no difference between two different words of which one is covered by T and the other is covered by T or U is a code word. The following property is a direct consequence of these remarks.

The code C is simultaneously T-correcting and U-detecting if and only if for any pair (s,t) in T and any pair (u,v) in the union of T and U the component d(C|s+u) of d(C) satisfies the inequality $$d(C|s+u) \geq t+v+1$$

If in any codeword e components, where $e \leq S-1$, are erased then we obtain a set of codewords of an [n−e,m] code C' over $GF(2^k)$ with minimum distance profile d(C')=(d(C'|0), ..., d(C'|n−e−1)), where d(C'|j) satisfies the inequality $$d(C'|j) \geq d(C|j+e)$$

What is claimed is:
1. A data processing device comprising:
   (a) four data processing modules (100, 102, 104, 106) which each include
   (i) corresponding data processing means (12, 14, 16, 18) having a data path width of at least 2n bytes, where n is an integer greater than or equal to one,
   (ii) a respective encoder module (20, 22, 24, 26) fed by the corresponding data processing means for bytewise encoding a processing result of 2n bytes to a respective encoding result of n bytes,
   (iii) a respective memory module (28, 30, 32, 34) fed by the respective encoder module for storing the respective encoding result, P2 (iv) respective input decoders (54, 56, 58, 60) for receiving said encoding results in groups of four bytes and therefrom reconstituting a two-byte data word representing said processing result for presentation to the corresponding data processing means,
   (b) an interconnection network ((82, 84, 86, 88) fed by the respective data processing modules for applying encoding results between all data processing modules and the respective input decoders,
   (c) mode register means for controlling said input decoders so that they assume respective first, second and third modes, so that
      (i) in the first mode, said input decoders accept and digest all bytes of one of said groups,
      (ii) in the second mode, the input decoders accept and digest three bytes of one of said groups but reject an associated fourth byte of said group, there being four possible modes designated the second mode, and
      (iii) in the third mode, the input decoders accept and digest two bytes of one of said groups but reject an associated combination of two remaining bytes of said group, there being six possible modes designated the third mode, and
wherein
said encoder modules multiply each byte of a data word by a regular matrix and add the multiplication bytes to produce a code byte, the four code bytes thus generated by the respective encoder modules constituting a code word, of a code with a minimum Hamming distance over the bits of seven, the three code bytes accepted in any second mode constituting a partial code word with a minimum Hamming distance over the bits of four, the two bytes accepted in any third mode constituting a representation of all bits of the associated processing result.

2. A data processing device as claimed in claim 1, wherein the code symbols are defined in a Galois field that has a normal basis.

3. A data processing device as claimed in claim 1 or 2, wherein said decoder comprises:
   an input for receiving any code byte of a code word;
   a first decoder module (200) fed by said input for determining syndrome symbols and by means of various multiplications thereof by powers of an r2-matrix generating characterizing boolean quantities ($f_{ij}$, $g_{ij}$, $h_{ij}$, $t_{ij}$);
   a second decoder module fed by said first decoder module (204) and bidirectionally interconnected to a mode register (202) for under control of a mode register content and said characterizing boolean quantities generating a selection signal (DSEL, ISEL);
   a third decoder module (208) fed in parallel with said first decoder module by said input for emulating 32 estimates by correction for as many single bit errors;
   a selection module fed by said input and by said third decoder module for receiving all real and emulated code symbols of a code word, and also fed by said second decoder module, for under control of a single "true" selection signal amidst a series of exclusively "false" selecting at least one correct nonemulated code symbol and one further correct code symbol, the latter being either emulated or not, and for outputting these two code symbols on a user output (218).

4. A device as claimed in claim 3, wherein said selection module has an error output for under control of exclusively received "false" selection signals outputting an error detection flag while blocking outputting of any code symbol.

* * * * *